United States Patent [19]

Standley

[11] Patent Number: 5,572,074
[45] Date of Patent: Nov. 5, 1996

[54] COMPACT PHOTOSENSOR CIRCUIT HAVING AUTOMATIC INTENSITY RANGE CONTROL

[75] Inventor: David L. Standley, Westlake Village, Calif.

[73] Assignee: Rockwell International Corporation, Seal Beach, Calif.

[21] Appl. No.: 469,989

[22] Filed: Jun. 6, 1995

[51] Int. Cl.$^6$ ................................................. H01H 47/24
[52] U.S. Cl. ........................... 307/117; 307/113; 363/23; 250/200; 250/206; 250/208.1; 250/214 R; 250/214 AG; 330/250
[58] Field of Search .................................. 307/117, 113; 363/23; 250/200, 206, 214 R, 214 AG, 208.1; 330/250

[56] References Cited

U.S. PATENT DOCUMENTS

| | | | |
|---|---|---|---|
| 3,839,646 | 10/1974 | Soloway ................................. | 307/205 |
| 4,173,723 | 11/1979 | Temes et al. ....................... | 250/214 R |
| 4,745,274 | 5/1988 | Muro ....................................... | 250/214 |
| 4,805,236 | 2/1989 | Urala ...................................... | 359/189 |
| 5,057,682 | 10/1991 | Michon et al. ..................... | 250/214 C |
| 5,059,814 | 10/1991 | Mead et al. ............................ | 307/201 |
| 5,155,348 | 10/1992 | Ballingal et al. .................... | 250/208.1 |
| 5,363,064 | 11/1994 | Mikamura ............................. | 330/308 |

OTHER PUBLICATIONS

Mann, "Implementing Early Visual Processing in Analog VLSI: Light Adaptation," *Visual Information Processing: From Neurons to Chips*, SPIE vol. 1473, pp. 128–136, Apr. 1991.

Delbrück et al., "Analog VLSI Phototransduction by Continuous, Adaptive, Logarithmic Photoreceptor Circuits," *Computation and Neural Systems Program*, Memo No. 30, pp. 1–23, Jul. 14, 1994.

Espejo et al., "Smart–Pixel Cellular Neural Networks in Analog Current–Mode CMOS Technology." *IEEE Journal of Solid–State Circuits*, vol. 29, No. 8, pp. 895–905, Aug. 1994.

*Primary Examiner*—William M. Shoop, Jr.
*Assistant Examiner*—Albert W. Paladini
*Attorney, Agent, or Firm*—John C. McFarren

[57] ABSTRACT

A compact photosensor circuit provides automatic intensity range control for machine vision systems. The circuit may be implemented with standard CMOS integrated circuit technology to provide high sensitivity, fully static operation, and automatic exposure control with no moving parts. For each pixel of an imaging array, a photodetector provides an input photocurrent to a corresponding photosensor circuit. The photodetector is connected to provide an output voltage and an input to the gates of a pair of series-connected FETs that act as an attenuator. The attenuator is connected to a biasing source that provides a floor bias voltage. An output of the attenuator is connected to the gate of a third FET connected to the input photocurrent. The output voltage responds as a function of the light intensity at the photodetector while the bias voltage determines the range of light intensity for normal operation of the photosensor circuit. In a photosensor array with an appropriate bias current, the image scene contrast is amplified while the photosensor circuits automatically adapt to the overall light intensity.

20 Claims, 4 Drawing Sheets

COMPACT PHOTOSENSOR CIRCUIT HAVING AUTOMATIC INTENSITY RANGE CONTROL

TECHNICAL FIELD

The present invention relates to photosensor image processing circuits and, in particular, to a compact photosensor amplifying circuit having high sensitivity and wide dynamic range that automatically adapts to overall light intensity.

BACKGROUND OF THE INVENTION

Machine vision systems combine light detection with image processing and special functions for a variety of applications. So called "smart" image sensors have been developed for gathering and processing images in real time to extract various image features that can be further processed by machine vision algorithms. The initial image processing steps can be important for removing significant loads from a subsequent digital processor, thus allowing production of lower cost machine vision systems. Experimental and commercial sensor systems such as these have been implemented as standard CMOS integrated circuits that incorporate photodiode arrays for image sensing.

Many applications for machine vision systems, especially those used in outdoor environments, require operation over a wide range of lighting conditions. Many of the established low-power analog feature extraction networks, such as for edge or object detection, for example, also require a local voltage signal as an input. Furthermore, some form of intensity compression (such as logarithmic compression, for example) is desirable to provide a uniform threshold of sensitivity for feature extraction from different parts of a scene. Logarithmic compression, however, tends to preclude the use of standard charge-based imaging, which has a linear response to intensity. Alternatively, continuous-time analog circuitry can provide intensity compression with the advantage that clocking overhead (and any associated crosstalk) can be reduced or eliminated.

One of the simplest and most compact photosensor circuits known in the prior art uses two diode-connected FETs in series to convert a photocurrent into a voltage that is logarithmic with respect to light intensity. Although this circuit operates over a wide range of light levels, it suffers from low sensitivity, having only twice the transistor subthreshold slope. Adding more FETs in series has limited effectiveness because threshold voltage becomes a constraint with respect to the direct current operating range of the circuit. One approach to circumvent this problem is temporal adaptation, which does not require an intensity-based referencing or gain/range control signal to be supplied to each pixel. For static scenes, such circuits null out all (or a significant fraction) of the incident light intensity on each pixel, but respond with relatively high sensitivity when the pixel brightness changes. In many of these circuits, the adaptation rate can be adjusted or the pixels can be effectively reset. Although useful in some situations, temporal adaptation is not suitable for applications where fully static scene image data may be needed.

Other prior art analog systems can operate on static images and null out some measure of the average intensity, including a spatially local average, for example. A nonlinear resistive grid can be used to compute a median intensity corresponding to a brightly lit region or a shadow in the scene (directly from a logarithmically compressed voltage signal), for example, and the difference between a pixel's intensity and its "regional average" can be amplified. Such a system requires a differential amplifier in each pixel for its signal to be locally available (and to avoid bussing the signal out of the array for amplification). Another known system uses currents directly from an array of phototransistors to compute a linear average across the whole array. The average current is then subtracted as a current-mode signal from the photocurrent at each pixel to provide an "auto-zeroed" output to a processing network. Although this circuit can be designed to be relatively compact, it does not provide an intensity-compressed voltage-mode output. Because of these limitations of prior art photosensor circuits, there is a need for a compact photo sensor amplifying circuit having high sensitivity and wide dynamic range that automatically adapts to overall light intensity.

SUMMARY OF THE INVENTION

The present invention comprises a compact photosensor circuit that provides automatic intensity range control for a machine vision system. The circuit may be implemented with standard CMOS integrated circuit technology to provide high sensitivity and fully static operation at low cost. With each pixel in a photodetector array including a photosensor circuit of the present invention, image contrast can be amplified while each photosensor circuit automatically adapts to the overall light intensity of the scene.

The present invention allows production of fully electronic cameras with automatic exposure control and no moving parts. In general, such cameras produce images that do not suffer from common motion picture illusions, such as the stroboscopic "wagon wheel" effect. The present photosensor circuit is especially well suited for providing machine vision in computer-controlled systems, such as some types of robots, for example.

The basic photosensor circuit of the present invention can have a sensitivity of at least several hundred millivolts per decade. For each pixel of an imaging array, a photodetector provides an input photocurrent $I_{in}$ to a corresponding photosensor circuit. The photodetector is connected to provide an output voltage $V_{out}$ and an input to the gates of a pair of series-connected NFETs that act as an attenuator. The attenuator is connected to a biasing source that provides a floor bias voltage. An output of the attenuator is connected to the gate of a third NFET whose drain is connected to the input photocurrent $I_{in}$ and the output voltage $V_{out}$. The output voltage $V_{out}$ follows a logarithmic function of the light intensity at the photodetector, while the bias voltage determines the range of light intensity for normal operation of the photosensor circuit.

A principal object of the invention is a compact, low cost photosensor circuit for an imaging array. A feature of the invention is a pair of series-connected FETs that function as a voltage attenuator. An advantage of the invention is a photosensor circuit with high sensitivity and wide dynamic range that automatically adapts to light intensity.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

The present invention comprises a compact, intensity compression photosensor circuit for a machine vision system. The circuit may be implemented with standard low cost CMOS integrated circuit technology to provide high sensitivity with the capability of fully static operation and automatic intensity adaptation. In a machine vision system, a compact photosensor circuit for each pixel of a photodetector array amplifies the scene contrast while automatically adapting to the overall light intensity.

Figure 1:
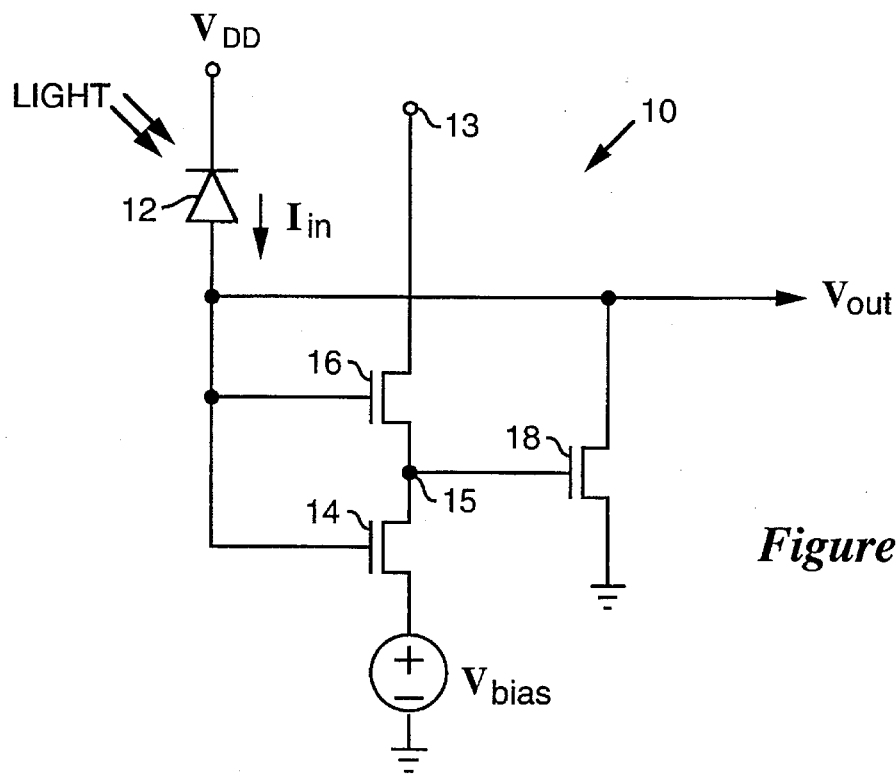
FIG. 1 is a schematic circuit diagram of a basic photosensor circuit of the present invention.

FIG. 1 illustrates a basic photosensor circuit 10 of the present invention. Circuit 10 can have a sensitivity of at least several hundred millivolts per decade. For each pixel of an imaging array, a photodetector 12, such as a photodiode, for example, provides an input photocurrent $I_{in}$ to a corresponding photosensor circuit 10. Photodetector 12 is connected to circuit 10 to provide an input to the gates of a pair of series-connected NFETs 14 and 16, an input to the drain of an NFET 18, and an output voltage $V_{out}$. The source of NFET 14 is connected to a biasing source, such as $V_{bias}$, that provides a floor bias voltage. The drain of NFET 16 may be connected at node 13 to a positive supply rail (such as $V_{DD}$), or it may provide a current output 99 that can be used in some embodiments of the invention as a by-product of circuit 10.

If NFET 16 is fabricated to be sufficiently long and narrow (i.e., physically in the integrated circuit) compared to NFET 14, and if NFETs 14 and 16 are operated above threshold, the NFET pair 14 and 16 will form an attenuator that functions as a single-ended static voltage attenuator (which does not use floating gate capacitor technology). Under these conditions, NFET 16 will be in saturation and NFET 14 will be in its ohmic region. The current through NFETs 14 and 16 will tend to follow a square law with respect to the quantity $(V_{out}-V_{bias}-V_{th})$, where $V_{th}$ is the threshold voltage of the NFETs. The resistance of NFET 14 will tend to follow the same quantity $(V_{out}-V_{bias}-V_{th})$ inversely. As a result, the voltage at the gate of NFET 18, which is connected to a common node 15 with the drain of NFET 14 and the source of NFET 16, will be approximately equal to the quantity $V_{bias}+K(V_{out}-V_{bias}-V_{th})$, where K is less than unity and is determined primarily by the dimensions of NFETs 14 and 16 (although higher-order effects, such as the body effect, will perturb K). The photocurrent $I_{in}$ is assumed to be small enough so that NFET 18 operates in subthreshold. Under the foregoing conditions, output voltage $V_{out}$ will follow a logarithmic function of the light intensity, with a sensitivity of 1/K times the subthreshold slope of NFET 18, while bias voltage $V_{bias}$ determines the range of light intensity for normal operation of circuit 10.

Figure 2:
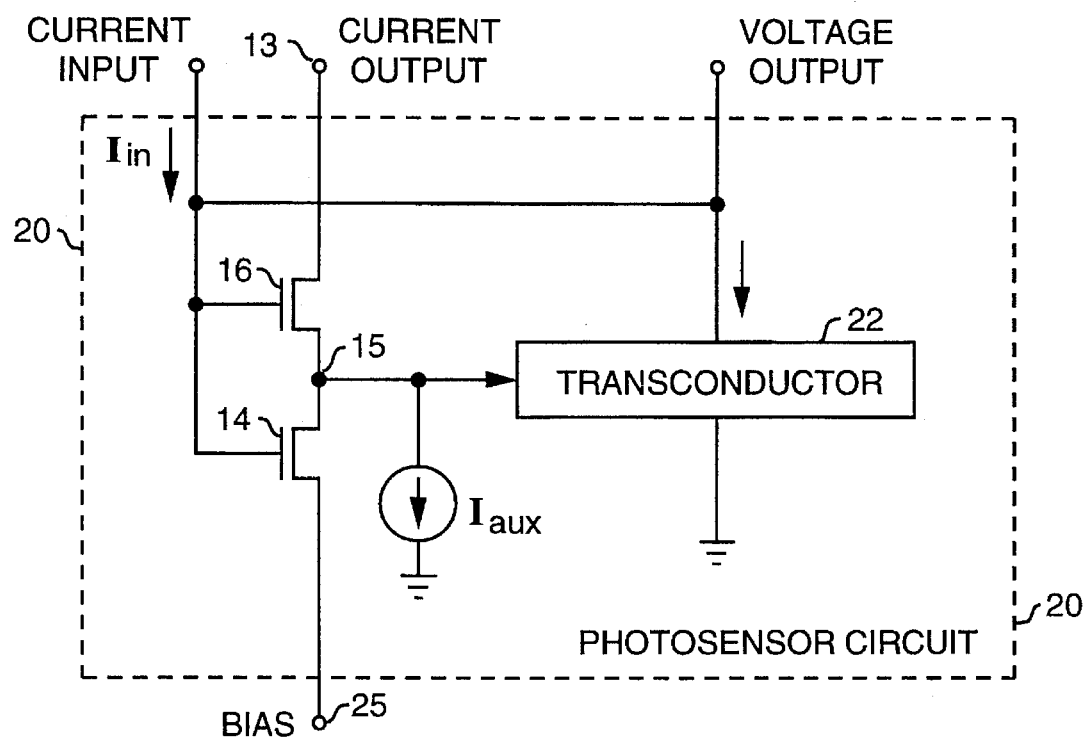
FIG. 2 is a schematic block diagram illustrating a modification of the photosensor circuit of the FIG. 1.

Photosensor circuit 20 illustrated in FIG. 2 is a variation of basic circuit 10. Photosensor circuit 20 includes NFETs 14 and 16, which function as a voltage attenuator as described above. The attenuator output at node 15 feeds into a transconductance means (or transconductor) 22 (such as NFET 18 in circuit 10), so that photosensor circuit 20 appears as a resistance to ground from the current input node. Bias node 25 provides the floor voltage for the attenuator (NFET pair 14 and 16), and the current output 13 is a byproduct of circuit 10 that can be used in some embodiments, as mentioned above. One aspect of the present invention is that a current source $I_{aux}$ can be used to prevent NFETs 14 and 16 from being cut off—if the voltages at bias node 25 and the current output node 13 are high enough, NFETs 14 and 16 will operate as source followers.

Figure 3:
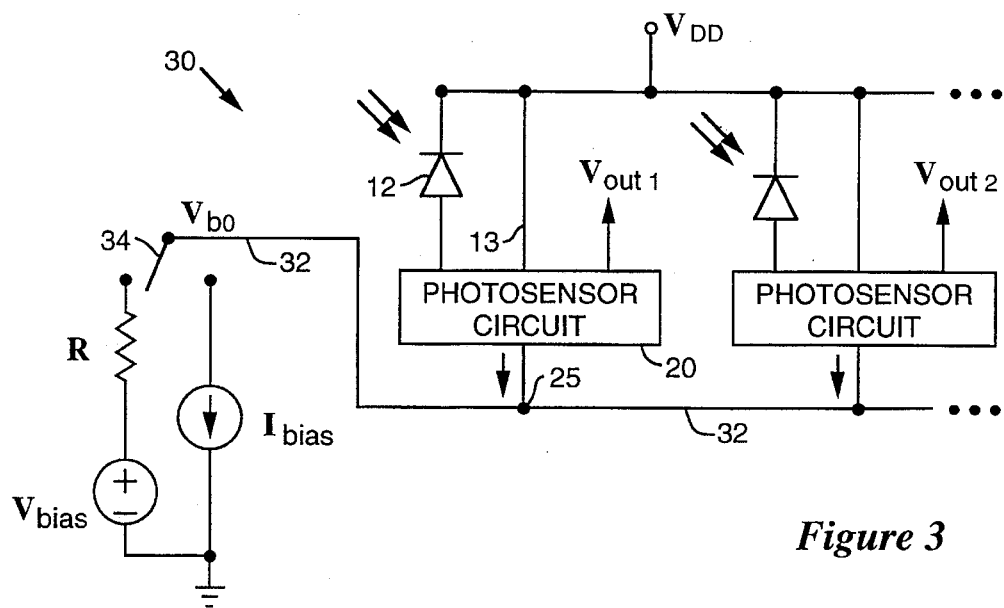
FIG. 3 is a schematic block diagram illustrating the photosensor circuit of FIG. 2 in a photosensor array.

FIG. 3 shows the basic circuits of FIGS. 1 and 2 used in a photosensor imaging array 30 to provide an automatic intensity control capability. In photosensor array 30, each photodiode 12 and the current output 13 of each photosensor circuit 20 are connected to a positive voltage supply rail ($V_{DD}$). The bias nodes 25 of all photosensor circuits 20 are connected to a common (global) bus 32 having bias voltage $V_{bo}$ above ground. Bus 32 can be connected by a switch 34 to a voltage source $V_{bias}$ through a resistance R (either intended or parasitic), or to a current source $I_{bias}$. These sources may be internal or external to photosensor array 30.

As a functional example, consider the circuits of FIGS. 2 and 3 in which $I_{aux}$ is zero for all pixels (i.e., photodiodes 12 and corresponding photosensor circuits 20) in array 30. If a voltage bias $V_{bias}$ with (ideally) zero resistance is used, then each pixel operates like the circuit shown in FIG. 1 (i.e., independently of the other pixels in array 30). However, if a current source $I_{bias}$ is used, then the total current out of the bias nodes 25 of pixel array 30 is constrained by $I_{bias}$. The current at each node 25 is roughly proportional to the square of the quantity $(V_{out}-V_{bo}-V_{th})$ for its corresponding pixel. If the light intensity of the image scene changes, $V_{bo}$ will automatically settle to a value that balances the currents with $I_{bias}$. The result is a voltage-mode output with high sensitivity to contrast within the image, but significantly reduced sensitivity to the average image intensity. Thus, array 30 with photosensor circuits 20 acts like a sensor with an automatic intensity range control. If resistance R is used in series with source $V_{bias}$, a more modest ratio between the contrast sensitivity and the average intensity can be obtained. Switch 34 can be used to toggle between two or more modes, as shown in FIG. 3. It should be apparent to one skilled in the art, therefore, that an important feature of the present invention is the ability to construct arrays of compact pixels with automatic intensity range control that can be overridden externally.

The auxiliary current source $I_{aux}$ shown in FIG. 2 is needed in some embodiments of the present invention. As explained above, NFETs 14 and 16 function as an attenuator if the transistors do not go below threshold. If the image scene is known to have limited contrast, and a sufficiently high $I_{bias}$ is used, then photosensor circuit 20 will operate satisfactorily without auxiliary source $I_{aux}$. However, if the desired light sensitivity, operating mode, DC circuit constraints, and image scene uncertainties are such that some pixels in array 30 could be very dim, then a low $I_{aux}$ current can be used to maintain NFETs 14 and 16 in the transition region between below-threshold and above-threshold operation. This prevents $V_{out}$ from dropping suddenly as the pixel intensity is lowered, which can happen if $I_{aux}$ is zero. (This is because NFETs 14 and 16, when below threshold, can feed a constant voltage into transconductor 22 and produce a constant current sink at the unbuffered voltage output.) With a low $I_{aux}$ current, light sensitivity will roll off smoothly but substantially as the pixel intensity is lowered, providing a soft floor for the response to dim pixels. As $I_{aux}$ is increased, the level of this floor increases.

Figure 4:
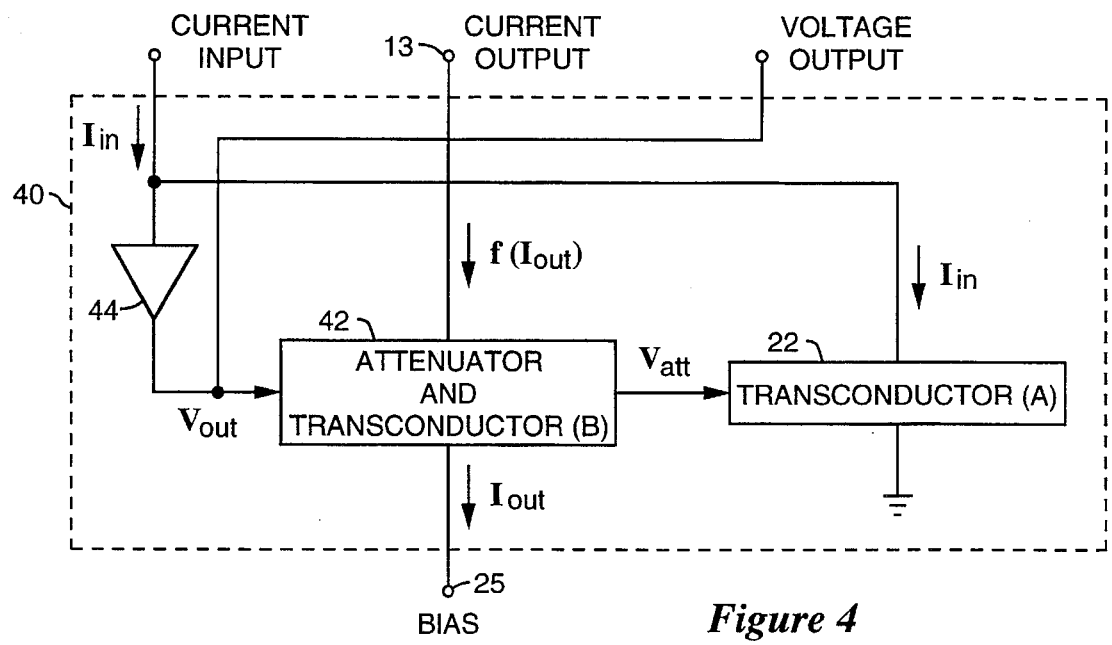
FIG. 4 is a schematic block diagram illustrating a modification of the photosensor circuit of FIG. 2.

The photosensor circuit of the present invention may be modeled as shown in the block diagram of photosensor circuit 40 illustrated in FIG. 4. Photosensor circuit 40 receives a current $I_{in}$ through the current input terminal. Current $I_{in}$ is conveyed to ground (or lower supply rail) through transconductor (A) 22. Transconductor (A) 22 is controlled by voltage $V_{att}$, which is an attenuation of voltage signal $V_{out}$. $V_{att}$ is offset by some portion of the voltage at bias node 25. Attenuator and transconductor (B) 42 supplies a current $I_{out}$ to bias node 25, such that $I_{out}$ is a monotonically increasing function of $V_{out}$ and a monotonically decreasing function of the voltage at bias node 25. As an option, transconductor (B) 42 can deliver a current $f(I_{out})$, which can be expressed as a function of $I_{out}$, to current output node 13. An amplifier 44 supplies signal $V_{out}$ as some function of the voltage at the current input terminal. Amplifier 44 may be omitted (as in FIGS. 1 and 2), or it may be a unity-gain buffer (with optional level shifting) that allows resistive loads to be connected to the voltage output, or it may be a voltage amplifier used to reduce the impedance seen at the current input node. An important feature of the present invention is the exploitation of the concurrent operation of attenuator and transconductor (B) 42, in conjunction with a global bus connected to a biasing means that imposes a constraint on current or current versus voltage, to provide automatic intensity range control for photosensor arrays, such as array 30.

Figure 5:
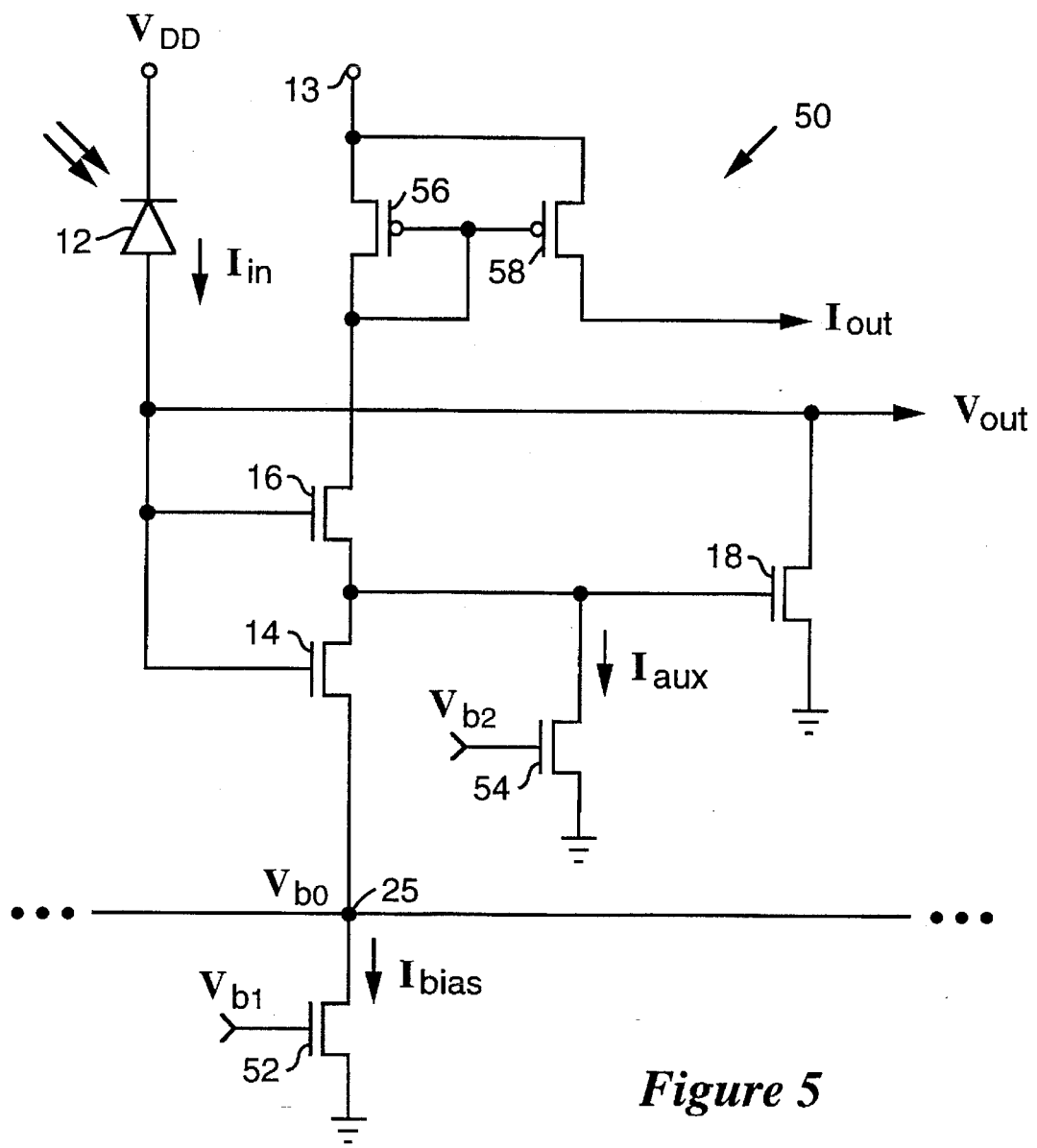
FIG. 5 is a schematic circuit diagram of an alternative embodiment of the photosensor circuit of the present invention illustrating a use of the current output.

An example embodiment of a complete transistor-level circuit diagram for one pixel circuit 50 of array 30 is shown in FIG. 5. NFETs 14 and 16 form the attenuator, as described above, and NFET 18 conducts the photocurrent. The current source $I_{bias}$ for an entire photosensor array 30 can be provided by the parallel connection of NFETs 52, as shown for the single pixel 50 in FIG. 5. In this example, $I_{bias}$ is controlled by voltage $V_{b1}$ applied to the gate of NFET 52. An advantage of this design is that photosensor arrays of different sizes can be built without adjusting or redesigning the bias sources. Voltage $V_{b2}$ applied to the gate of NFET 54 controls the auxiliary current $I_{aux}$ through NFET 54. A current mirror comprising PFETs 56 and 58 can be used to sample the current through NFET 16, which indicates the intensity of pixel 50 relative to the average intensity over the array 30. Ideally, current $I_{out}$ through the drain of PFET 58 has no modulation with the average array intensity. $I_{out}$ can be used as a separate image output or as an input to a comparator for thresholding, for example. As an alternative, the drain current through NFET 16 can be sampled directly, provided the drain voltage remains high enough to keep NFET 16 in saturation.

Figure 6:
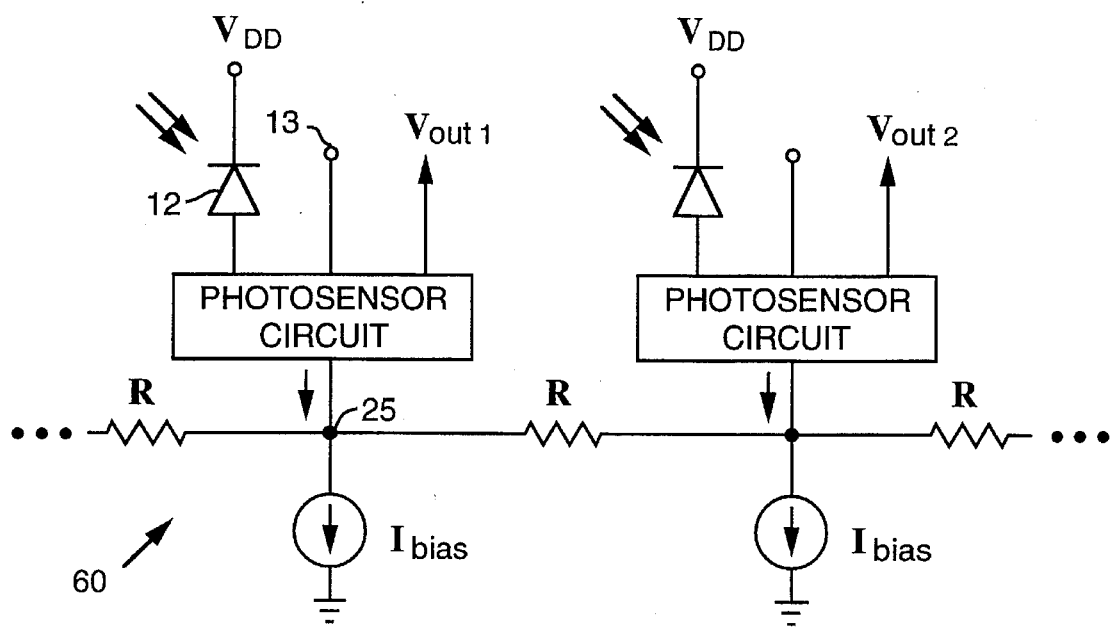
FIG. 6 is a schematic block diagram illustrating an alternative embodiment of a photosensor array.

In another embodiment of the present invention, spatially localized automatic intensity range control in a photosensor array 60 can be obtained by replacing global bus 32 of FIG. 3 with a network of resistance means R, as shown in FIG. 6. This embodiment uses the photosensor circuits 20 of FIGS. 2 and 3, but includes a bias source $I_{bias}$ for each pixel. A resistance R is connected between the bias terminals of each adjacent pixel. If resistance R were zero, there would be a net flow of current from brighter regions to darker regions of array 60, and the resulting global bus would carry a voltage dependent on the average intensity over array 60 with approximately one subthreshold slope of sensitivity. However, if resistance R is sufficiently positive, the large series combination of resistance means R between widely spaced regions of different intensities inhibits intensity control based on an average across array 60. Thus, positive values of resistance R cause automatic intensity control to act primarily on an average intensity within a neighborhood around a given pixel. Higher values of resistance R cause increasingly localized intensity averaging. At its bias node 25, each photosensor circuit 50 appears as a moderately nonlinear but low value resistance, on the order of a fraction of the ohmic resistance of NFET 14 at its operating point, depending on the attenuation factor. As a result, appropriate values of resistance R can be achieved by using polysilicon resistors or MOS transistors, such as NFETs having their gates connected to a positive supply rail.

Figure 7:
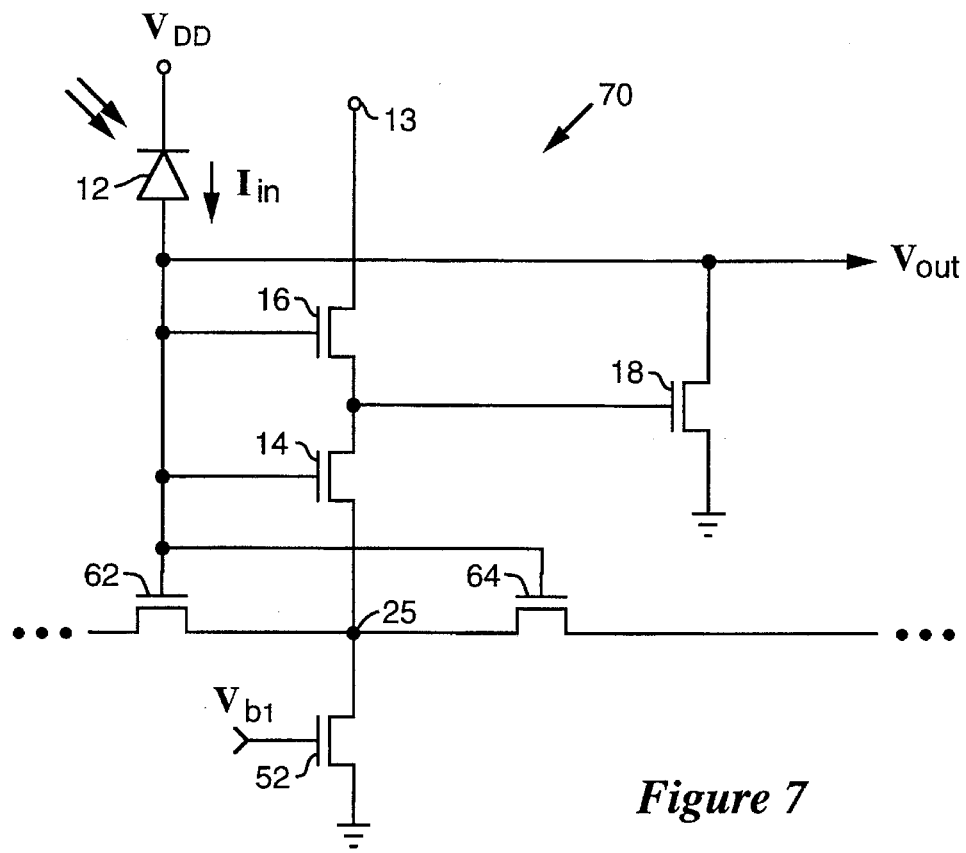
FIG. 7 is a schematic circuit diagram of an alternative embodiment of the photosensor circuit of the present invention.

FIG. 7 is a transistor-level diagram of a pixel circuit 70 of a one-dimensional photosensor array that is a modification of the system shown in FIG. 6. Transistors 14, 16, 18, and 52 function as described above. NFETs 62 and 64 function as resistance means between adjacent pixels. The gates of NFETs 62 and 64 are connected to the $V_{out}$ node, with the result that the resistance of NFETs 62 and 64 is modulated by $V_{out}$. In an image scene, circuit 70 will respond to a boundary of low or moderate contrast in a manner similar to that of array 60 with linear resistances because the resistance perturbations of NFETs 62 and 64 (caused by the $V_{out}$ values of the two adjacent pixels at the boundary) will approximately cancel. If the boundary contrast is high, however, the pixel on the dark side will tend to shut off NFETs 62 and 64, thus limiting the edge-enhancing distortion effect of the outputs near the boundary. An auxiliary current source $I_{aux}$ is not needed with the circuit of FIG. 7 because the action of NFETs 62 and 64, along with the bias current through NFET 52, will automatically impose a lower limit on the current through NFETs 14 and 16.

Although the present invention has been described with respect to specific embodiments thereof, various changes and modifications can be carried out by those skilled in the art without departing from the scope of the invention. In particular, the exemplary embodiments describe photodiodes which provide a sourcing current, but complimentary embodiments for sinking currents can be constructed by simply substituting NFETs for PFETs and PFETs for NFETs. Furthermore, the principles described for one-dimensional photosensor arrays are easily extended to two-dimensional arrays. Therefore, it is intended that the present invention encompass such changes and modifications as fall within the scope of the appended claims.

I claim:

1. A photosensor circuit, comprising:
   a photodetector providing a current input and a voltage output in response to light intensity;
   an attenuator comprising first and second FETs connected in series with a bias source and providing an attenuator output, said first and second FETs having gates connected to said current input;
   a transconductance means connected to receive said current input and said attenuator output; and
   said voltage output responding as a function of said light intensity.

2. The photosensor circuit of claim 1, wherein said transconductance means comprises a third FET connected to said current input, said third FET having a gate connected to a node between said first and second FETs.

3. The photosensor circuit of claim 1, wherein said bias source comprises a bias node connected to at least one neighboring photosensor circuit in a photodetector array.

4. The photosensor circuit of claim 3, wherein said bias node comprises a global bus connected to a current source.

5. The photosensor circuit of claim 3, wherein said bias node comprises a global bus having a switching means for selectively switching bias modes.

6. The photosensor circuit of claim 3, wherein said bias node is connected by resistive means to said at least one neighboring photosensor circuit in said photodetector array.

7. The photosensor circuit of claim 3, wherein said bias node is connected to said at least one neighboring photosensor circuit by a fourth FET having a gate connected to said current input.

8. A photosensor circuit for a pixel in a photodetector array, comprising:

a photodetector providing a current input and a voltage output in response to light intensity;

an attenuator comprising first and second FETs connected in series to a bias node and having gates connected to said current input;

a transconductance means connected to said current input and to an attenuator node between said first and second FETs to receive an output of said attenuator; and said voltage output responding as a function of said light intensity.

9. The photosensor circuit of claim 8, wherein said transconductance means comprises a third FET connected between said current input and ground, said third FET having a gate connected to said attenuator node between said first and second FETs.

10. The photosensor circuit of claim 9, wherein said bias node is connected to a corresponding bias node of at least one neighboring photosensor circuit in said photodetector array.

11. The photosensor circuit of claim 10, wherein said bias node comprises a global bus connecting said photodetector array to a current source.

12. The photosensor circuit of claim 10, wherein said bias node is connected by resistive means to said corresponding bias node of said at least one neighboring photosensor circuit in said photodetector array.

13. The photosensor circuit of claim 10, wherein said bias node is connected to said corresponding bias node of said at least one neighboring photosensor circuit by a fourth FET having a gate connected to said current input.

14. The photosensor circuit of claim 8, wherein said first FET comprises a first NFET having a source connected to said bias node and a drain connected to said attenuator node, and said second FET comprises a second NFET having a source connected to said attenuator node.

15. A photosensor circuit for a pixel in a photodetector array, comprising:

a photodetector providing a current input and a voltage output in response to light intensity;

a bias node connected to a bias source and to a corresponding bias node of at least one neighboring photosensor circuit in said photodetector array;

an attenuator comprising first and second FETs connected in series to said bias node and having gates connected to said current input;

a transconductance means comprising a third FET connected between said current input and ground and having a gate connected to an attenuator node between said first and second FETs to receive an output of said attenuator; and said voltage output responding as a logarithmic function of said light intensity.

16. The photosensor circuit of claim 15, wherein said connected bias nodes comprise a global bus connecting a current source to said photodetector array.

17. The photosensor circuit of claim 15, wherein said bias node is connected by resistive means to said corresponding bias node of said at least one neighboring photo sensor circuit.

18. The photosensor circuit of claim 15, wherein said bias node is connected to said corresponding bias node of said at least one neighboring photosensor circuit by a fourth FET, said fourth FET having a gate connected to said current input.

19. The photosensor circuit of claim 15, further comprising an auxiliary current source connected to said attenuator node and said gate of said third FET.

20. The photosensor circuit of claim 15, wherein said first FET comprises a first NFET having a source connected to said bias node and a drain connected to said attenuator node, said second FET comprises a second NFET having a source connected to said attenuator node, and said third FET comprises a third NFET having a drain connected to said current input and a source connected to ground.

* * * * *